United States Patent [19]

Okayama et al.

[11] 4,075,488
[45] Feb. 21, 1978

[54] PATTERN FORMING APPARATUS USING QUADRUPOLE LENSES

[75] Inventors: Shigeo Okayama, Mitaka; Hisazo Kawakatsu, Higashi-Kurume, both of Japan

[73] Assignee: Agency of Industrial Science & Technology, Tokyo, Japan

[21] Appl. No.: 687,690

[22] Filed: May 19, 1976

Related U.S. Application Data

[63] Continuation-in-part of Ser. No. 610,847, Sept. 5, 1975, abandoned.

[30] Foreign Application Priority Data

Sept. 6, 1974   Japan .................................. 49-101966

[51] Int. Cl.$^2$ ................................................ H01J 3/14
[52] U.S. Cl. .................................. 250/396 R; 250/398; 250/492 A
[58] Field of Search ........ 250/492 A, 396 R, 396 ML, 250/397, 398, 399, 400; 313/361

[56] References Cited

U.S. PATENT DOCUMENTS

| | | | |
|---|---|---|---|
| 2,919,381 | 12/1959 | Glaser | 250/396 R |
| 3,118,050 | 1/1964 | Hetherington | 250/492 A |
| 3,201,631 | 8/1965 | Gale | 250/396 R |
| 3,547,074 | 12/1970 | Hirschfeld | 250/492 A |
| 3,956,635 | 5/1976 | Chang | 250/492 A |

*Primary Examiner*—Craig E. Church
*Attorney, Agent, or Firm*—Kurt Kelman

[57] ABSTRACT

Disclosed is a pattern forming apparatus using a quadrupole lens system to control the cross section of a beam of electrons or ions to be projected onto a plate-like object. A variety of rectangular beams can be formed by electrically controlling the quadrupole lens system, and thus a desired pattern can be produced in the form of combination of rectangle and line pattern elements when the plate-like object is exposed to the beam of electric charged particles. The pattern forming apparatus according to this invention is useful particularly in fabricating integrated circuits, semiconductor devices and other precision devices.

22 Claims, 18 Drawing Figures

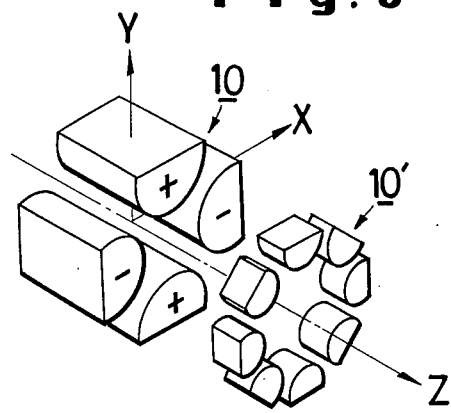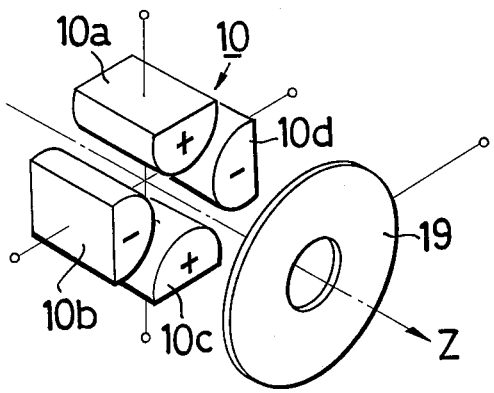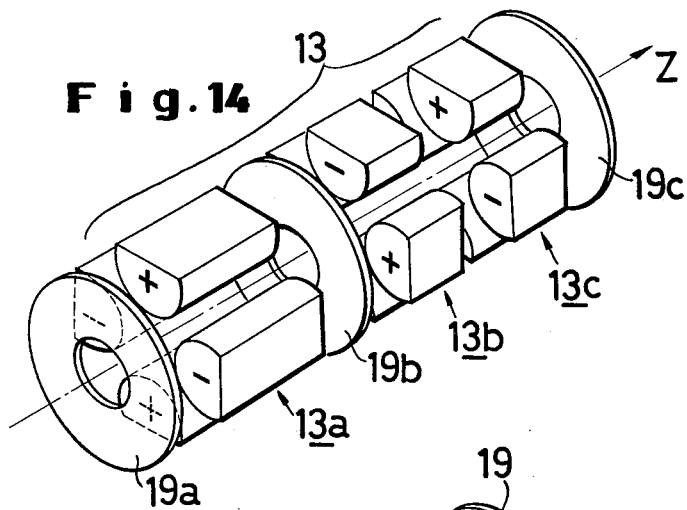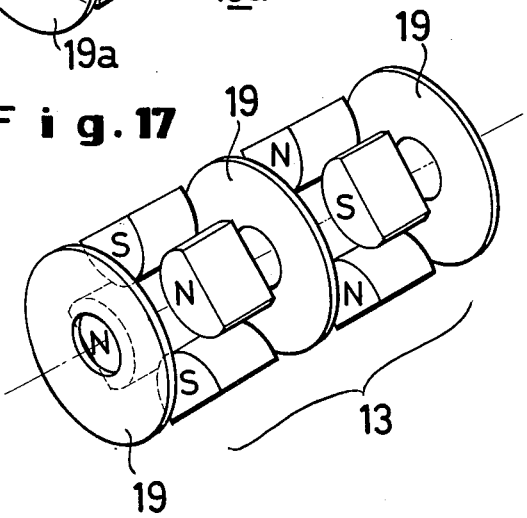

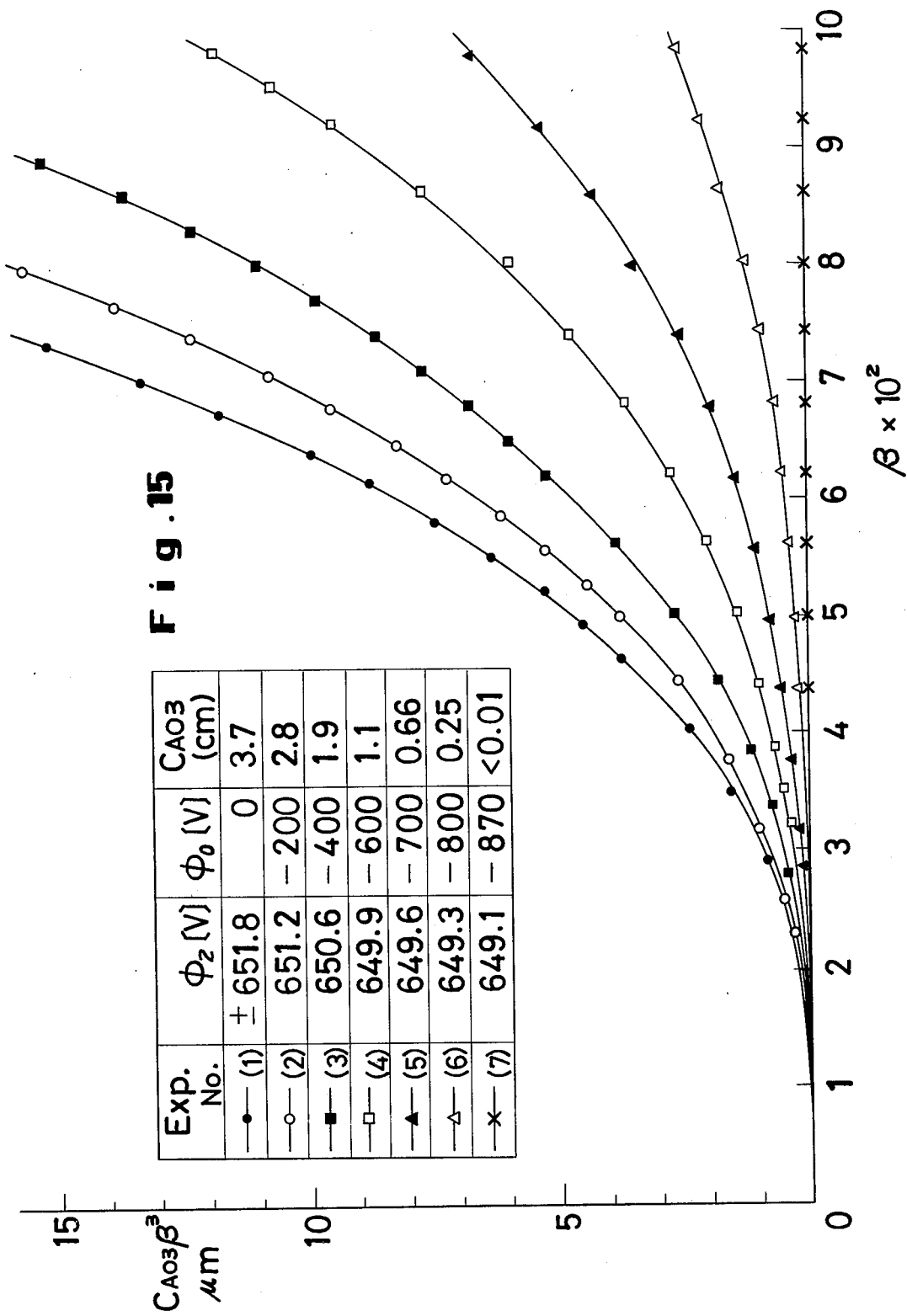

PATTERN FORMING APPARATUS USING QUADRUPOLE LENSES

REFERENCE TO COPENDING APPLICATION

This is a continuation-in-part application of our copending application U.S. Ser. No. 610,847 filed Sept. 5, 1975, now abandoned.

BACKGROUND OF THE INVENTION

This invention relates to an apparatus for forming a desired pattern on a plate-like object with a beam of electrons or ions, and more particularly to such a pattern forming apparatus which is useful in engraving a desired electric circuit pattern on the properly treated major surface of a semiconductor substrate.

In fabricating integrated circuits and other precision semiconductor devices, the photolithography technique has hitherto been used. But disadvantageously, the accuracy with which a desired pattern can be formed on a substrate is limited by the diffraction effect which depends on the wave length of the light used (ultra-violet rays). In this connection, in fabricating highly compact IC's, acoustic wave transducers and other devices having a minute pattern of a sub-micron order, a scanning type electron beam pattern generator such as shown in FIG. 1 is used.

In FIG. 1, a beam of electrons from an electron gun 1 passes through a condenser lens 3 and an objective lens 5 so that it is focused on an object 7 in the form of a minute spot. 4 and 4a are aperture diaphragms to limit the converging angle of the beam. A blanking unit 2 is responsive to blanking signals for the on-off controlling of the beam. A beam-deflector unit 6 is responsive to deflecting signals for causing the beam to scan the object and permits the minute spot of the beam to draw a desired pattern thereon. The pattern can be formed by causing the minute spot 8 of the beam to scan the object in such a way that a selected portion 9 is uniformly exposed as shown in FIG. 2.

In actual practice, the scanning type pattern generator is controlled by an associated electronic computer. Specifically, the pattern generator is responsive to blanking and deflecting signals both supplied from the electronic computer for stopping and shifting the electron beam so as to draw a desired pattern on the object. It is required for obtaining an accurate pattern that the beam control system involve complicated compensations for distortion, astigmatism and the shift of the focus each of which varies with the deflection angle of the beam.

With a view to reducing the adverse effect by the aperture aberration of the objective lens on the precision of the pattern to be formed, the converging angle of the beam must be reduced, but this accordingly decreases the beam current, and the pattern exposure time increases by as much. The exposure time can be decreased if a high-sensitivity electron resist is used. In such case there arises a necessity for providing beam on-off and beam deflection and correction controls having high speed response.

An object of this invention is to provide a pattern forming apparatus which permits the formation of a desired pattern on an object at a high speed and with high accuracy, requiring no complicated control.

SUMMARY OF THE INVENTION

To attain the object described above, the present invention provides an apparatus for forming a rectangular or linear shape pattern on an object with a beam of electrically charged particles, which comprises a source for a beam of electrically charged particles; a diaphragm having a rectangular aperture for forming said beam into a rectangular beam; a quadrupole lens system comprising at least one quadrupole for reducing or increasing the lengths of the four sides of said rectangular beam at a desired ratio; a means for controlling said quadrupole lens system and a means for shifting the resultant beam to fall at a desired position on the object. The apparatus according to the present invention also has such a construction that it is possible to easily include a means for correcting third order aperture aberration of the quadrupole lens into the quadrupole lens system when it is necessary to form a pattern of high accuracy, and therefore it can be applied to devices having a minute pattern of a sub-micron order, such as an LSI.

This invention will be better understood from the following description of preferred embodiments of this invention made with reference to the accompanying drawings.

BRIEF DESCRIPTION OF THE DRAWINGS

FIG. 8 is a perspective view showing a lens system which comprises in combination a quadrupole lens and an octopole lens.

FIG. 9 is a perspective view showing a fundamental lens system which comprises a quadrupole lens and a means for correcting third order aperture aberration of the quadrupole lens.

FIG. 14 is a perspective view showing an embodiment of the lens system which comprises quadrupole lenses and a means for correcting third order aperture aberration.

FIG. 15 is a graph showing the results obtained by correcting third order aperture aberration of the lens system of FIG. 9.

FIG. 7 is a perspective view showing still another embodiment of the lens system which comprises quadrupole lenses and a means for correcting third order aperture aberration.

DESCRIPTION OF THE PREFERRED EMBODIMENTS

This invention takes full advantage of the unique electrooptical nature of the quadrupole lens. Most of the patterns which appear on IC devices are composed of line and rectangle elements, some of these being of the same shape and size. The principle of this invention is to control the shape (cross section) of a beam of electrically charged particles and to project a variety of rectangular cross section beams onto a substrate, thus composing the desired pattern from line and rectangle pattern elements.

Figure 1:
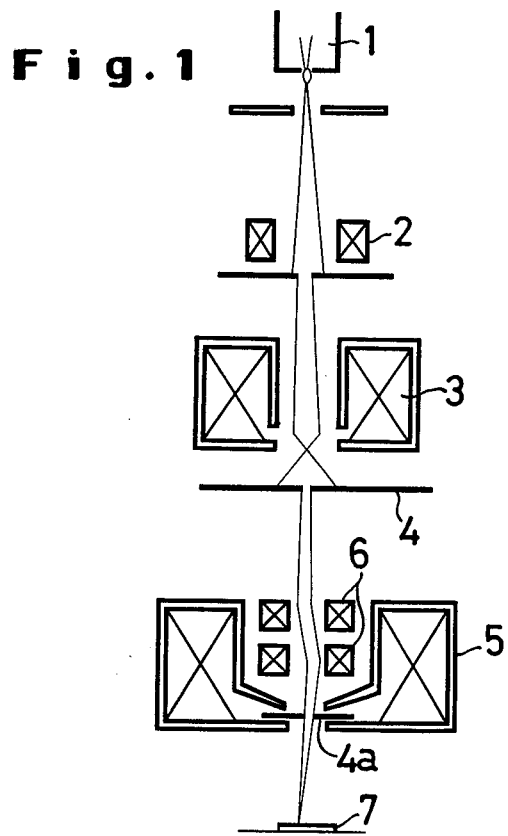
FIG. 1 is a sectional view of a scanning type electron beam pattern generator.
Figure 2:
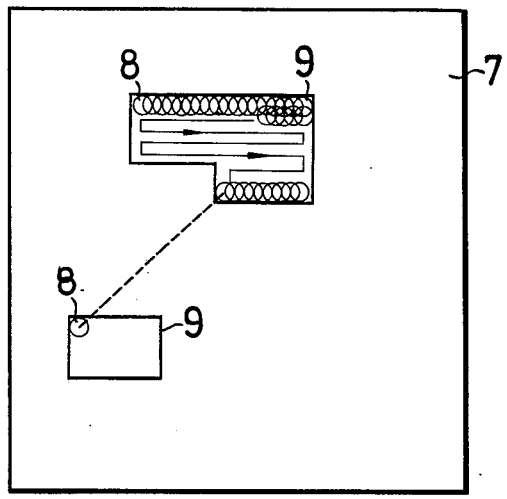
FIG. 2 is an explanatory view showing the manner in which a desired pattern is drawn with a scanning type electron beam pattern generator.
Figure 3:
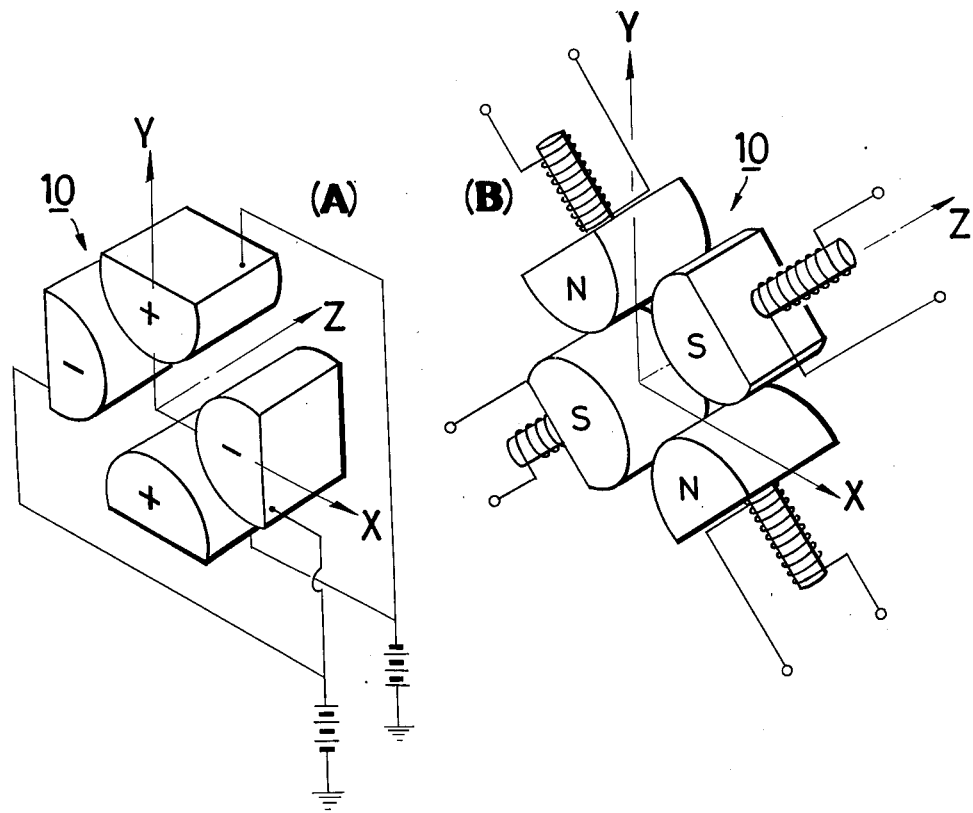
FIGS. 3(A) and 3(B) are perspective views of an electrostatic quadrupole lens and a magnetic quadrupole lens respectively.

FIG. 3(A) shows an electrostatic quadrupole lens 10, and FIG. 3(B) shows a magnetic quadrupole lens 10. When a beam of electrically charged particles travels in the direction of the "Z"-axis, the quadrupole lens functions as a converging (convex) lens in the X-Z plane whereas it functions as a diverging (concave) lens in the Y-Z plane.

Figure 4:
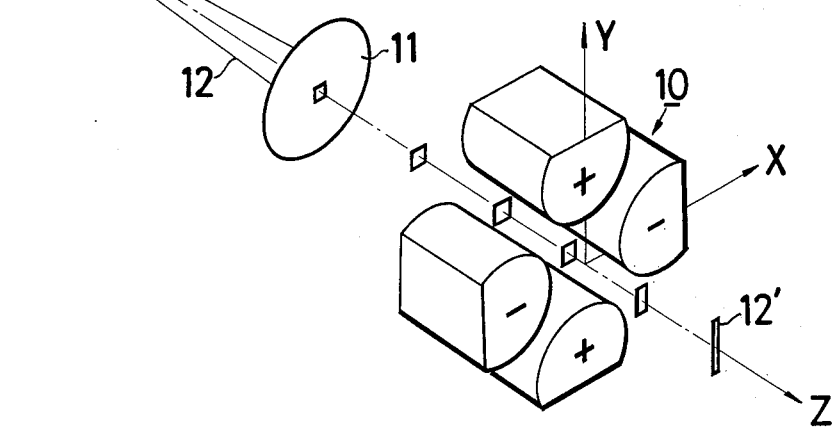
FIG. 4 is an explanatory view showing the manner in which the cross section of the beam is modified while the beam passes through the quadrupole lens.

Referring to FIG. 4, the cross section of an electron beam 12 is limited by the rectangular aperture 11, and while passing the quadrupole lens 10, the rectangular beam diverges along the "Y"-axis (or vertical direction) and at the same time it converges along the "X"-axis (or horizontal direction).

As a result, the vertical length is increased and the horizontal length is reduced, thus forming a rectangular beam 12' shown at the exit of the quadrupole lens 10. A beam of desired rectangular cross section can be provided by properly controlling the voltage (or current) supplied to the quadrupole lens.

Figure 5:
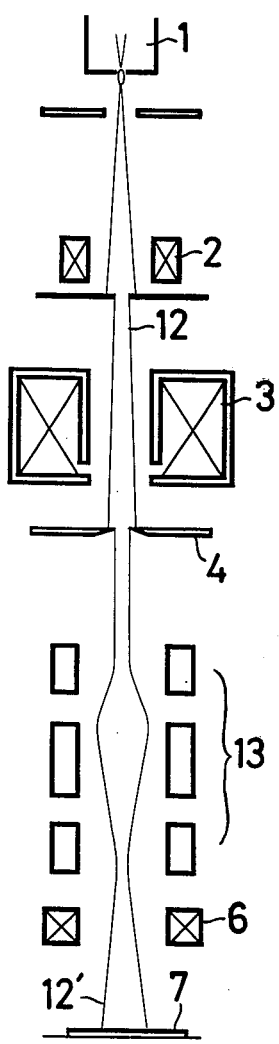
FIG. 5 is a sectional view showing the structure of a pattern forming apparatus according to this invention.

Referring to FIG. 5, there is shown a pattern forming apparatus according to this invention. A beam of electrons 12 from an electron gun 1 are converged by a condenser lens 3 to fall on a rectangular aperture 4. The cross section of the beam is shaped by the rectangular aperture 4, and the resultant rectangular beam passes through a quadrupole lens system 13 and through a beam-deflection unit 6 so that a beam 12' having a desired rectangular cross section falls on a desired position of the substrate 7. The blanking unit 2 is responsive to blanking signals for controlling the exposure time, depending on the size of the rectangular cross section beam. The beam-deflection unit 6 is not necessary if means are provided instead for shifting the object 7 relative to the beam.

Figure 6A:
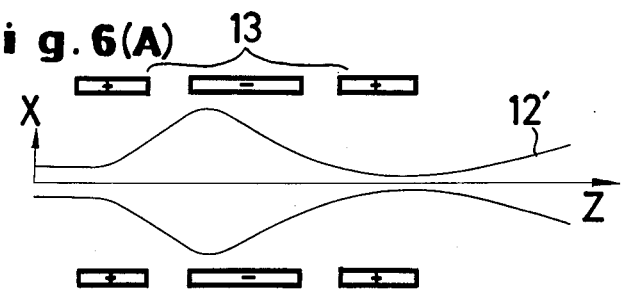
FIG. 6 is a schematic illustration showing the trajectory of the electron beam in the X-Z plane (above) and that of the electron beam in the Y-Z plane (below) while passing through the quadrupole lens system.
Figure 6B:
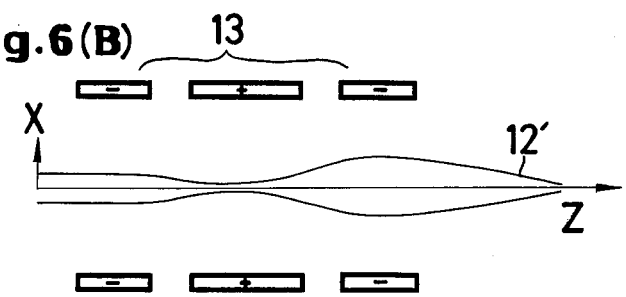

FIG. 6 shows the trajectories of the electron beam in the X-Z plane (FIG. 6(A)) and Y-Z plane (FIG. 6(B)) while passing through an electrostatic quadrupole triplet.

In actual practice it is often advantageous to use two or more quadrupole lenses to produce rectangular beams of several micron or smaller in the variety of shapes required to compose the desired pattern.

Figure 7:
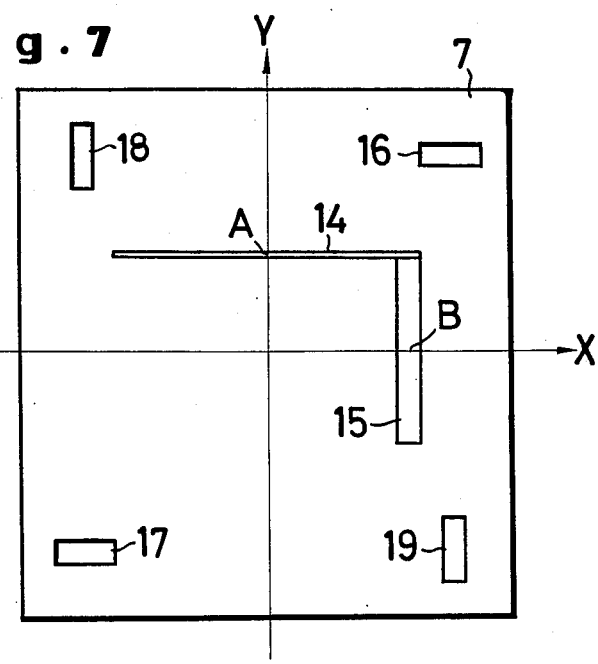
FIG. 7 is an explanatory view showing the manner in which a desired pattern is formed on a substrate, using a pattern forming apparatus according to this invention.

FIG. 7 shows the manner in which a desired pattern is drawn or formed on an object 7 by a pattern forming apparatus according to this invention. In forming a line pattern element 14 on the object surface, the beam-deflection unit 6 is controlled so that the electron beam is shifted from the origin "O" to a selected point "A", and the rectangular cross section of the electron beam is changed into the desired rectangle by controlling the voltage supplied to the quadrupole lens system 13. In forming a rectangle pattern element 15 on the object surface 7, the electron beam is shifted to a selected point "B", and the quadrupole lens system is properly controlled to give the required size and the shape to the beam. These two similar and subsequent operations permit the formation of an "L"-shaped pattern on the object.

In forming a plurality of identical rectangle pattern elements, it is only necessary to repeatedly shift the beam to different positions as required while the quadrupole lens system remains at the same excitation.

It it is desired to form the same rectangle pattern element at a symmetrical place with respect to the origin "O" (rectangel pattern elements 16 and 17), it is only necessary to reverse the polarity of the deflection signal. Specifically, the rectangle pattern element 18 can be formed by reversing the polarity of the excitation of the quadrupole lens system and by reversing the polarity of the "X"-axis deflection signal against the element 16. Similarly, the element 19 can be formed by reversing the polarities of the quadrupole excitation and of the "X"-axis deflection signal against the element 17.

As mentioned above, a desired pattern can be formed by controlling the quadrupole lens system to give different sizes and shapes to the cross section of the beam for forming corresponding different pattern elements, rectangles and lines on an object; by controlling the beam-deflection unit to cause the beam to fall on a desired position of theobject; and by controlling the beam on-off to supply the amount of exposure requied for forming the pattern element on the object.

In the pattern forming apparatus according to this invention, control of beam on-off and beam deflection is much less complicated than in the conventional pattern generator using a scanning beam and the control can be more easily performed. The volume of control signals required to form the pattern elements with the quadrupole lens system is not small, but the total volume of control signals required for forming a desired pattern is relatively small because the same pattern elements are repeatedly used in forming the desired pattern.

The use of the quadrupole lens system permits the beam to focus in a line of several millimeters in length by 0.5 or less microns in width, and this fine line is useful in forming IC wiring elements. As for the quadrupole lens, differently from the rotationally symmetrical lens conventionally used, the major component of the electric or magnetic field of the quadrupole lens extends transverse to the path of the beam as a strong lesn. Therefore, a quadrupole lens system of large bore diameter can be designed, which makes it possible to reduce the effects of distortion and aperture aberration.

In the quadrupole lens system described above, the resolution at the edge portion of a rectangular or linear pattern element varies in proportion as the size of said pattern element changes. This is because the aperture aberration varies with the change in lens strength of the individual quadrupoles composing said quadrupole lens system.

To permit formation of a pattern of higher accuracy, therefore, it is desirable that such aberration be eliminated as much as possible.

Generally in the quadrupole, desired correction of the third-order aperture aberration which is unattainable in the conventional round lens can be accomplished by combining said quadrupole 10 with an octopole 10' as shown in FIG. 8.

In the quadrupole-octopole lens system, high machining accuracy is required. A slight alignment error in the positional relationship between the quadrupole and the octopole, therefore, not only results in a severe degradation of the aperture aberration correcting characteristic but also brings about mechanical aberration as an extra disadvantage. Thus these adverse effects render the materialization of the quadrupole-octopole lens system extremely difficult. The desired correction of the aperture aberration can easily be accomplished by disposing in front of and/or behind the quadrupole an electrode defining an aperture on the optical axis of the quadrupole as illustrated in FIG. 9 and supplying thereto positive or negative voltage.

FIG. 9 illustrates a basic arrangement which composes an aperture aberration correction lens system. When the aperture electrode 19 defining of an aperture is disposed coaxially with the optical axis of the electrostatic quadrupole 10 and a voltage is supplied thereto, the fringing effect is brought about in the neighborhood of the end surface of the quadrupole 10 and consequently the action of the electrostatic octopole lens is formed. As a consequence, there can be formed an aperture aberration correction lens which combines the quadrupole lens action with the action of the octopole lens which is maintained in automatical alignment with the quadrupole electrode (hereinafter referred to as "self-alignment correction quadrupole lens"). In FIG. 9, 10 denotes an electrostatic quadrupole and 19 an electrode which has an aperture coaxial with the optical axis of said quadrupole 10, namely the portion forming the path of the beam of charged particles. By supplying a certain positive or negative voltage to the aperture electrode 19, there can be formed the self-alignment correction quadrupole lens which incorporates into the quadrupole lens action the octopole lens action exactly aligned with the quadrupole (viz., which enables an octopole field exactly aligned with the quadrupole within a quadrupole field).

Now, the relationship between the voltages supplied to the electrodes and the distribution of lens potential which determines the lens characteristic will be described.

Figure 10:
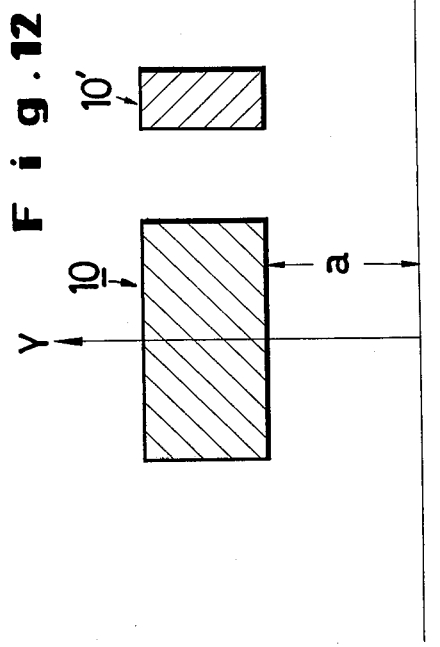
FIG. 10 is a cross sectional view of the lens system of FIG. 9.

FIG. 10 shows the self-alignment correction quadrupole lens of FIG. 9 in a cross section taken in the plane Y-Z.

By Cartesian co-ordinates like those shown in FIG. 10, the potential of an electrostatic lens system possessed of four planes of symmetry is generally expressed as follows.

$$\Phi(X, Y, Z) = [\Phi_0(Z) - \tfrac{1}{4}\Phi_0''(Z)(X^2+Y^2) + 1/64\Phi_0''''(Z)(X^2+Y^2)^2 - \ldots] + [\Phi_2(Z)(X^2-Y^2) - 1/12\Phi_2''(Z)(X^4-Y^4) + \ldots] + [\Phi_4(Z)(X^4-6X^2Y^2+Y^4) - \ldots] \quad (1)$$

In the foregoing formula (1), the first term within the brackets, [ ], is a term corresponding to the potential of a unipotential lens component, the second term within the brackets is a term corresponding to the electrostatic quadrupole lens component and the third term within the brackets is a term corresponding to the electrostatic octopole lens component respectively.

Assume that a voltage $+\phi_2[V]$ is supplied to the electrodes (poles) 10a and 10c and a voltage $-\phi_2[V]$ to the electrodes 10b and 10d and a voltage $\phi_0[V]$ is supplied to the aperture electrode, then the values of $\Phi_0(Z)$, $\Phi_2(Z)$ and $\Phi_4(Z)$ of the formula (1) will be expressed as follows.

$$\Phi_0(Z) = C_0 \cdot \phi_0 k_0(Z)$$

$$\Phi_2(Z) = C_2(\phi_2/a^2)k_2(Z)$$

$$\Phi_4(Z) = C_4(\phi_0/a^4)k_4(Z)$$

wherein, $a$ is the aperture radius of the quadrupole lens, $k_0(Z)$, $k_2(Z)$ and $k_4(Z)$ are characteristic functions representing in the normalized form of distribution the respective lens components along the Z axis and $C_0$, $C_2$ and $C_4$ are constants determining the maximum value of distribution.

The distribution of these characteristic functions and the constants $C_0$, $C_2$ and $C_4$ are determined by the geometry of the self-alignment correction quadrupole lens in actual use, namely the length of the quadrupole and the thickness of aperture electrode in the direction of Z axis, the radii of their apertures and the distance between the quadrupole and the aperture electrode.

Figure 11:
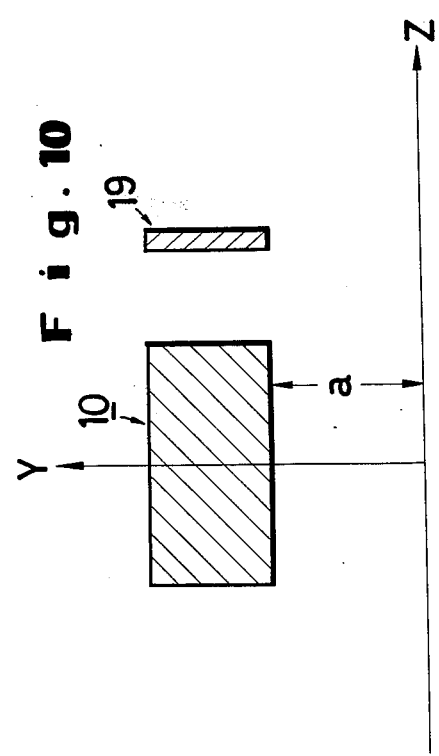
FIG. 11 is a diagram showing characteristic functions of the lens system of FIG. 9.

Typical distributions, corresponding to the positions of the electrodes of FIG. 10, of said characteristic functions along the Z axis are shown in FIG. 11. The electrostatic octopole lens action is sufficiently effective, even though the voltage supplied to the aperture electrode 19 of FIG. 9 is less than a few percent of the accelerating voltage of the beam of charged particles. Accordingly, the unipotential lens action represented by the first term in the brackets of said Formula (1) is very weak, so that the lens focussing characteristic depends mainly on the quadrupole lens action represented by the second term in the brackets of said Formula (1).

The distribution of the constant $k_4(Z)$ corresponding to the electrostatic octopole lens component occurs within the lens field of quadrupole 10 and has its peak near the edge portion of quadrupole 10 as is evident from FIG. 11.

Figure 12:
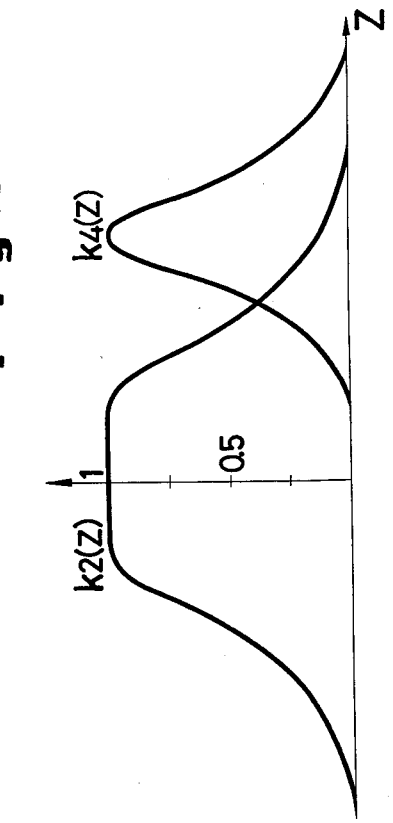
FIG. 12 is a cross sectional view of the lens system of FIG. 8.
Figure 13:
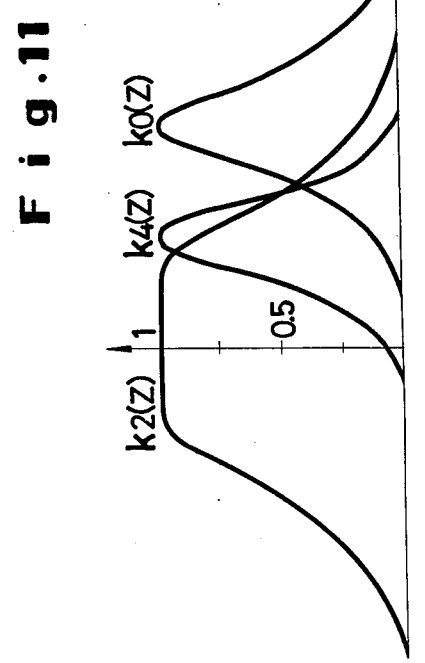
FIG. 13 is a diagram showing characteristic functions of the lens system of FIG. 8.

To facilitate comprehension of the specificity of the characteristic function distribution, a cross section taken in the plane Y-Z of the quadrupole-octapole lens of FIG. 8 is shown in FIG. 12 and the distribution of the characteristic functions $k_2(Z)$ and $k_4(Z)$ of this lens along Z axis, corresponding to the positions of quadrupole and octopole of FIG. 12, are shown in FIG. 13. FIG. 9 represents a type having one aperture electrode disposed on one side of just one quadrupole. FIG. 14, by contrast, illustrates a preferred embodiment in which aperture electrodes are disposed one each at the extremities of a multi-stage quadrupole 13 and between the two quadrupoles.

In FIG. 14, the aperture electrodes 19a and 19b serve to give the octopole lens action to the neighborhood of each end surface of the quadrupole 13a. In the case of the quadrupoles 13b and 13c, the aperture electrodes 19b and 19c serve to give the octopole lens action to the neighborhood of the end surfaces of said quadrupoles facing their respective aperture electrodes.

Generally, the aperture aberration of image plane in a rotationally symmetrical lens can be defined as satisfying the equation $\Delta r(Z_i) = C_A \gamma^3$ in third order approximation (wherein, $\gamma$ is the semi-aperture angle of the charged particle ray in the image plane). In the case of the quadrupole lens, let $\alpha$ and $\beta$ be the semi-aperture angles in the Y-Z and X-Z planes respectively, and the third-order aperture aberrations $\Delta y(Z_{iy})$ and $\Delta x(Z_{ix})$ in the respective directions of Y and X axes will be expressed as follows.

$$\Delta y(Z_{iy}) = C_{A30}\alpha^3 + C_{A12}\alpha\beta^2$$
$$\Delta x(Z_{ix}) = C_{A03}\beta^3 + C_{A21}\alpha^2\beta \quad (2)$$

In the quadrupole lens, there are a total of four third-order aperture aberration coefficients ($C_{A30}$, $C_{A12}$, $C_{A03}$ and $C_{A21}$). FIG. 15 shows the results of measurement of the correction characteristic of third-order aperture aberration by the self-alignment correction quadrupole lens illustrated in FIG. 16. In the lens used in this particular measurement, the electrode of the quadrupole had a length of 3cm, the aperture electrodes had a thickness of 0.1cm, the aperture radii of the quadrupole and the aperture electrode were 0.52cm and the quadrupole and the aperture electrodes were separated by a distance of 0.6cm.

These results are from the measurement of the aperture aberration due to the aperture aberration coefficient $C_{A03}$. The voltage $\phi_0[V]$ supplied to the aperture electrode 19a was changed under the condition of a constant focal length of 3.1cm and a constant accelerating voltage of electron beam of 20KV, while the aperture electrode 19b was fixed at 0[V]. The values of $C_{A03}$ found in the table inserted in the graph (FIG. 15) are those calculated on the basis of the results of said measurement.

Exp. (1) represents a case in which the aperture electrode 19a was at 0 V and Exp. (6) a case having the aperture electrode 19a at −800 V (4% of the accelerating voltage). Comparison clearly shows that the aberration coefficient which was as much as 3.7cm in the case of Exp. (1) was corrected to 0.25cm.

Further in the case of Exp. (6), the voltage supplied to the quadrupole was 2.5 V less than that in Example (1). This difference represents the extent to which the unipotential lens action indicated in Formula (1) was compensated by the quadrupole lens, showing that the unipotential lens action was very weak.

Figure 16:
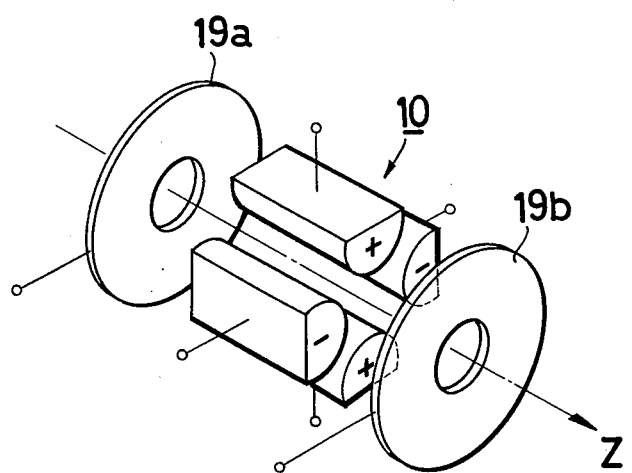
FIG. 16 is a perspective view showing another fundamental lens system which comprises a quadrupole lens and a means for correcting third order aperture aberration of the quadrupole lens.

In the lens system shown in FIG. 16, the aperture aberration coefficients $C_{A03}$ and $C_{A21}$ can be corrected by supplying a negative and a positive voltages to the aperture electrodes 19a and 19b.

For sufficiently eliminating the aberration in the lens system as shown in FIG. 14, it is required to supply voltages of 1 - 10% of the accelerating voltage of the beam of electric charged particles to each of three or four aperture electrodes.

The voltage required when the aperture aberration coefficients $C_{A03}$ and $C_{A21}$ are corrected simultaneously is higher than that required when only one of the aperture aberration coefficients is corrected.

In the case of an electron beam having an accelerating voltage of 20KV, for example, if a positive voltage of 648.9V is applied to the quadrupole, a negative voltage of 900V to the aperture electrode 19a and a positive voltage of 1,100V to the aperture electrode 19b, then both the aperture aberration coefficients $C_{A03}$ and $C_{A21}$ are corrected to 0.05cm. The magnitude of the octopole lens action increases with the decreasing distance between the aperture electrode and the end surface of the quadrupole.

However, said distance is desirably about 0.5 to 2 times the radius of the aperture of the quadrupole in consideration of the machining accuracy of the lens.

The description has so far covered the self-alignment correction quadrupole lens which combines the electrostatic quadrupole with the aperture electrode. From the foregoing description, it is plain that the electrostatic octopole lens action can also be formed near the end surface of a magnetic quadrupole by virtue of the fringing effect when an aperture electrode possessed of an aperture on the optical axis of a magnetic quadrupole is disposed and voltage is supplied thereto. The combination of the magnetic quadrupole and the aperture electrode of the present invention is effective, therefore, as a self-alignment correction quadrupole lens.

FIG. 17 illustrates a preferred embodiment wherein aperture electrodes are disposed one each at both extremities of a two stage magnetic quadrupole lens system (Doublet) 13 and between the two component magnetic quadrupoles, and voltages are supplied to the aperture electrodes 19 respectively whereby the fringing effects are brought about in the neighborhoods of the end surfaces of the magnetic quadrupoles and consequently the actions of the electrostatic octopole lens are formed.

The embodiments mentioned above use a beam of electrons to form a desired pattern on a substrate. The electrostatic quadrupole lens has the same functions for a beam of ions, which are much heavier than electrons, and therefore the apparatus according to this invention is useful in ion implantation. In carrying out a maskless ion implantation process, it is very difficult to provide a very small diameter beam spot because of the space charge effect, and the formation of such a beam spot is not preferred in view of the corresponding loss of beam current. To the contrary, if the maskless ion implantation is carried out according to this invention, the ion implantation is performed in an extensive shape and size determined by the quadrupole lens system, and advantageously the unsymmetrical ion beam ejecting from a mass separator can be used effectively.

What is claimed is:

1. An apparatus for forming a rectangular or linear shaped pattern on an object with a beam of electrically charged particles, which comprises:
   a. a source of a beam of electrically charged particles,
   b. a diaphragm having a rectangular aperture for shaping the beam into a rectangular beam having four sides,
   c. a quadrupole lens system comprising at least one quadrupole lens,
   d. means for controlling the quadrupole lens systems for changing the ratio of the lengths of adjacent sides of the the rectangular beam to a desired ratio, and
   e. means for shifting the rectangular beam the lengths of whose sides have been changed to impinge upon a desired position on the object.

2. The apparatus according to claim 1, wherein said quadrupole lens is of an electrostatic type.

3. The apparatus according to claim 1, wherein said quadrupole lens is of a magnetic type.

4. The apparatus according to claim 1, wherein said quadrupole lens system further comprises a means for correcting third order aperture aberration of the quadrupole lens.

5. The apparatus according to claim 4, wherein said means comprises at least one aperture electrode having an aperture coaxial with the quadrupole lens system and a means for supplying voltage to said aperture electrode.

6. The apparatus according to claim 5, further comprising a source of an accelerating voltage applied to the beam, the voltage applied to the aperture electrode being 1 – 10% of the accelerating voltage.

7. The apparatus according to claim 5, wherein said one aperture electrode is disposed in the vicinity of one side of said quadrupole lens which one side faces said source for the beam of electric charged particles.

8. The apparatus according to claim 5, wherein said one aperture electrode is disposed in the vicinity of one side of said quadrupole lens which one side faces the object.

9. The apparatus according to claim 5, wherein said one aperture electrode is disposed between two quadrupole lenses.

10. The apparatus according to claim 1, wherein said source for the beam of electrically charged particles is an electron gun.

11. The apparatus according to claim 1, wherein said source for a beam of electric charged particles is an ion source.

12. A quadrupole lens system comprising at least one quadrupole lens having two end surfaces, an aperture electrode adjacent at least one of the end surfaces and having an aperture coaxial with the quadrupole lens, and means for supplying a voltage to the aperture electrode for producing the effect of a combined quadrupole-octopole lens system.

13. The quadrupole lens system according to claim 12, wherein said quadrupole lens is of a magnetic type.

14. The quadrupole lens system according to claim 12, wherein said quadrupole lens is of an electrostatic type.

15. The quadrupole lens system according to claim 12, further comprising a source of a beam of electrically charged particles, one of the end surfaces facing the source of the beam, and the aperture electrode being positioned between the one end surface the source of the beam.

16. The quadrupole lens system according to claim 12, further comprising an object, one of the end surfaces facing the object, and the aperture electrode being positioned between the one end surface and the object.

17. The quadrupole lens system according to claim 12, further comprising a source of a beam of electrically charged particles and an object arranged to receive the beam, one of the end surfaces facing the source of the beam and the other one of the end surfaces facing the object, and respective ones of the aperture electrodes being positioned between the end surfaces and the source of the beam and the object, respectively.

18. The quadrupole lens system according to claim 12, wherein a plurality of aperture electrodes are disposed one each between each of a plurality of quadrupole lenses and the quadrupole lens adjacent thereto.

19. The quadrupole lens system of claim 12, further comprising a source of electrically charge particles and a source of an accelerating voltage applied to the beam, the voltage applied to the aperture electrode being 1 – 10% of the accelerating voltage.

20. A method of forming a rectangular or linear shaped pattern on an object with a beam of electrically charged particles, which comprises the steps of:
  a. passing a beam of electrically charge particles through a rectangular aperture to shape the beam into a rectangular beam having four sides,
  b. changing the ratio of the lengths of adjacent sides of the rectangular beam to a desired ratio, and
  c. shifting the rectangular beam the lengths of whose sides have been changed to impinge the same upon a desired position on the object.

21. The method according to claim 20, wherein said beam of electrically charged particles is an electron beam.

22. The method according to claim 20, wherein said beam of electrically charged particles is an ion beam.

* * * * *